(12) United States Patent
Walsworth et al.

(10) Patent No.: US 10,901,062 B2
(45) Date of Patent: Jan. 26, 2021

(54) SYNCHRONIZED-READOUT FOR NARROWBAND DETECTION OF TIME-VARYING ELECTROMAGNETIC FIELDS USING SOLID STATE SPINS

(71) Applicant: President and Fellows of Harvard College, Cambridge, MA (US)

(72) Inventors: Ronald L. Walsworth, Newton, MA (US); David Glenn, Cambridge, MA (US); Dominik Bucher, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 214 days.

(21) Appl. No.: 16/304,369

(22) PCT Filed: May 24, 2017

(86) PCT No.: PCT/US2017/034256
§ 371 (c)(1),
(2) Date: Nov. 26, 2018

(87) PCT Pub. No.: WO2018/052497
PCT Pub. Date: Mar. 22, 2018

(65) Prior Publication Data
US 2020/0278414 A1    Sep. 3, 2020

Related U.S. Application Data

(60) Provisional application No. 62/341,497, filed on May 25, 2016.

(51) Int. Cl.
*G01R 33/60* (2006.01)
*G01N 24/12* (2006.01)
*G01R 33/12* (2006.01)
*G01R 33/26* (2006.01)
*G01R 33/32* (2006.01)

(52) U.S. Cl.
CPC ............. *G01R 33/60* (2013.01); *G01N 24/12* (2013.01); *G01R 33/1284* (2013.01); *G01R 33/26* (2013.01); *G01R 33/323* (2013.01)

(58) Field of Classification Search
CPC ..... G01N 24/12; G01R 33/1284; G01R 33/26
See application file for complete search history.

(56) References Cited

U.S. PATENT DOCUMENTS

| | | | |
|---|---|---|---|
| 7,466,127 B2 | 12/2008 | Chandrakumar et al. |
| 8,547,090 B2 | 10/2013 | Lukin et al. |
| 9,784,804 B2 | 10/2017 | Walsworth et al. |
| 10,126,377 B2 | 11/2018 | Hahn et al. |
| 2012/0319684 A1 | 12/2012 | Gambetta et al. |

(Continued)

OTHER PUBLICATIONS

"Code-division multiple access," definition; Wikipedia; reviewed on Apr. 29, 2016, 10 pages. (https://en.wikipedia.org/wiki/Code-division_multiple_access).

(Continued)

*Primary Examiner* — Alvaro E Fortich
(74) *Attorney, Agent, or Firm* — Wilmer Cutler Pickering Hale and Dorr LLP (57) ABSTRACT

A synchronized readout (SR) technique for spectrally selective detection of oscillating magnetic fields with sub-millihertz resolution, using coherent manipulation of solid state spins.

20 Claims, 6 Drawing Sheets

(56) References Cited

U.S. PATENT DOCUMENTS

| | | | |
|---|---|---|---|
| 2014/0061510 A1 | 3/2014 | Twitchen et al. | |
| 2014/0072008 A1 | 3/2014 | Faraon et al. | |
| 2014/0166904 A1 | 6/2014 | Walsworth et al. | |
| 2014/0191752 A1* | 7/2014 | Walsworth | B82Y 10/00 324/300 |
| 2014/0197831 A1* | 7/2014 | Walsworth | G01R 33/1284 324/304 |
| 2015/0001422 A1 | 1/2015 | Englund et al. | |
| 2015/0009746 A1* | 1/2015 | Kucsko | G06N 10/00 365/152 |
| 2015/0048822 A1 | 2/2015 | Walsworth et al. | |
| 2015/0192532 A1 | 7/2015 | Clevenson et al. | |
| 2015/0253355 A1 | 9/2015 | Grinolds et al. | |
| 2015/0316598 A1 | 11/2015 | Rogge et al. | |
| 2016/0054402 A1 | 2/2016 | Meriles | |
| 2016/0061914 A1 | 3/2016 | Jelezko et al. | |
| 2016/0097832 A1 | 4/2016 | Suzuki | |
| 2016/0161583 A1 | 6/2016 | Meriles et al. | |
| 2017/0343695 A1 | 11/2017 | Stetson et al. | |
| 2018/0149717 A1 | 5/2018 | Jelezko et al. | |
| 2018/0203080 A1 | 7/2018 | Acosta et al. | |
| 2019/0049495 A1 | 2/2019 | Ofek et al. | |
| 2019/0235031 A1 | 8/2019 | Ibrahim et al. | |

OTHER PUBLICATIONS

Aasi et al., "Enhancing the sensitivity of the LIGO gravitational wave detector by using squeezed states of light." Nature Photonics, vol. 7, No. 8, Oct. 1, 2013, 10 pages.
Abanin et al. "A Theory of many-body localization in periodically driven systems." Annals of Physics, vol. 372, Aug. 11, 2015, 8 pages.
Abanin et al., "A rigorous theory of many-body prethermalization for periodically driven and closed quantum systems." Communications in Mathematical Physics, Jul. 11, 2017, vol. 354, No. 3. arXiv Jul. 9, 2017, 21 pages.
Abanin et al., "Exponentially slow heating in periodically driven many-body systems." Physical Review Letters, vol. 115, No. 25, Jul. 29, 2015, 5 pages.
Abe et al., "Electron spin coherence of phosphorus donors in silicon: Effect of environmental nuclei," Physical Review B, Sep. 2, 2010, vol. 82, 121201. pp. 1-4.
Acosta et al., "High nitrogen-vacancy density diamonds for magnetometry applications," Physical Review B—Condensed Matter and Materials Physics (2009) 80, 1. arXiv: 0903.3277, Jul. 31, 2009. 24 pages.
Acosta et al., "Temperature dependence of the nitrogen-vacancy magnetic resonance in diamond," Physical Review Letters (2010) 104, 070801. arXiv: 0911.3938, Feb. 17, 2010. 5 pages.
Allred et al., "High-sensitivity atomic magnetometer unaffected by spin-exchange relaxation." Physical Review Letters, Sep. 23, 2002, vol. 89, No. 13, 4 pages.
Augustine et al., "SQUID detected NMR and NQR," Solid State Nuclear Magnetic Resonance, Mar. 1998, vol. 11, pp. 139-156.
Badilita et al., "Microscale nuclear magnetic resonance: a tool for soft matter research," Soft Matter, Jun. 2012, vol. 8, pp. 10583-10597.
Bar-Gill et al., "Solid-state electronic spin coherence time approaching one second," Nature Communications, published Apr. 23, 2013, vol. 4, Article No. 1743, 6 pages.
Barry et al., "Optical magnetic detection of single-neuron action potentials using quantum defects in diamond." Proceedings of the National Academy of Sciences, Dec. 6, 2016, vol. 113, No. 49, pp. 14133-14138 and E6730. 7 pages.
Basko et al., "Metal-insulator transition in a weakly interacting many-electron system with localized single-particle states." Annals of Physics, Feb. 2, 2008, vol. 321, No. 5, 99 pages.
Bauch et al. "Ultralong Dephasing Times in Solid-State Spin Ensembles via Quantum Control," Physical Review X, Jul. 25, 2018, vol. 8, 031025, pp. 1-11.
Beauchamp, Applications of Walsh and Related Functions: With an Introduction to Sequency Theory, (from the series on Microelectronics and Signal Processing), Academic Press, London, Feb. 11, 1984, entire book: pp. ix-308.
Belthangady et al., "Dressed-State Resonant Coupling between Bright and Dark Spins in Diamond," Physical Review Letters, Apr. 12, 2013 vol. 110, 157601, pp. 1-5.
Betzig, "Nobel Lecture: Single molecules, cells, and super-resolution optics," Reviews of Modern Physics, Oct. 21, 2015, vol. 87, No. 4, pp. 1153-1168.
Bloom et al., "An optical lattice clock with accuracy and stability at the $10^{-18}$ level." Nature, Feb. 6, 2014, vol. 506, No. 7486, pp. 71-75 (7 total pages).
Bohnet et al., "Quantum spin dynamics and entanglement generation with hundreds of trapped ions." Science, vol. 352, No. 6291, Jan. 7, 2016, 40 pages.
Budker et al., "Proposal for a cosmic axion spin precession experiment (CASPEr)," Physical Review X, published May 19, 2014, vol. 4, No. 2, pp. 021030-1 to 021030-10.
Bugrij, "The correlation function in two dimensional (sing model on the finite size lattice. I." Theoretical and Mathematical Physics, Apr. 2001, vol. 127, No. 1, 25 pages.
Choi et al., "Depolarization Dynamics in a Strongly Interacting Solid-State Spin Ensemble," Physical Review Letters, Mar. 3, 2017, vol. 118, No. 9, 6 pages.
Choi et al., "Dynamical engineering of interactions in qudit ensembles." Physical Review Letters, Nov. 3, 2017, vol. 119, No. 18, 6 pages.
Choi et al., "Observation of discrete time-crystalline order in a disordered dipolar many-body system." Nature, vol. 543, No. 7644, author manuscript Sep. 8, 2017, pp. 221-225 (23 total pages).
Clevenson et al., "Broadband magnetometry and temperature sensing with a light-trapping diamond waveguide," Nature Physics, May 2015, vol. 11, pp. 393-397. (6 pages).
De Lange et al., "Controlling the quantum dynamics of a mesoscopic spin bath in diamond," Scientific Reports, Apr. 25, 2012, vol. 2, No. 382, pp. 1-5.
De Lange et al., "Universal dynamical decoupling of a single solid-state spin from a spin bath." Science, Oct. 1, 2010, vol. 330, No. 6000, 16 pages.
Degen et al., "Nanoscale magnetic resonance imaging," Proceedings of the National Academy of Sciences of the United States of America, Feb. 3, 2009, vol. 106(5), pp. 1313-1317.
Degen et al., "Quantum sensing," Reviews of Modern Physics, Jul. 25, 2017, vol. 89, No. 3, pp. 035002-1 to 035002-39.
Deutsch et al., "Spin self-rephasing and very long coherence times in a trapped atomic ensemble." Physical Review Letters, Jul. 9, 2010, vol. 105, No. 2, 4 pages.
DeVience et al., "Nanoscale NMR spectroscopy and imaging of multiple nuclear species," Nature Nanotechnology, Jan. 5, 2015, vol. 10, pp. 129-134 (7 total pages).
Diddams et al., "An optical clock based on a single trapped 199Hg+ ion," Science, Aug. 3, 2001, vol. 293, No. 5531, pp. 825-828.
Doherty et al., "The nitrogen-vacancy colour centre in diamond," Physics Reports, published online Mar. 4, 2013, vol. 528, pp. 1-45.
Dreau et al., "Avoiding power broadening in optically detected magnetic resonance of single NV defects for enhanced DC-magnetic field sensitivity," Physical Review B, Nov. 23, 2011, vol. 84(19), 3 pages.
Dutta et al., "Phase transitions in the quantum Ising and rotor models with a long-range interaction." Physical Review B, Oct. 18, 2001, vol. 64, No. 18, 7 pages.
Elliott et al., "The Ising model with a transverse field. I. High temperature expansion." Journal of Physics C: Solid State Physics, Oct. 1971, vol. 4, No. 15, pp. 2359-2369 (12 total pages).
Else et al., "Floquet time crystals." Physical Review Letters, Aug. 26, 2016, vol. 117, No. 9, 5 pages.
Else et al., "Prethermal phases of matter protected by time-translation symmetry." Physical Review X, Mar. 7, 2017, vol. 7, No. 1, 21 pages.
Essler et al., "Finite temperature dynamical correlations in massive integrable quantum field theories." Journal of Statistical Mechanics: Theory and Experiment, vol. 2009, No. 09, Oct. 7, 2009, 54 pages.

(56) References Cited

OTHER PUBLICATIONS

Fang et al., "High-Sensitivity Magnetometry Based on Quantum Beats in Diamond Nitrogen-Vacancy Centers," Physical Review Letters, Mar. 26, 2013, vol. 110, 130802, pp. 1-5.
Farfurnik et al., "Optimizing a Dynamical Decoupling Protocol for Solid-State Electronic Spin Ensembles in Diamond," Physical Review B, Aug. 24, 2015, vol. 92(6), 5 pages.
Fey et al., "Critical behavior of quantum magnets with long-range interactions in the thermodynamic limit." Physical Review B, vol. 94, No. 7, Sep. 5, 2016, 12 pages.
Fisher et al., "Critical exponents for long-range interactions." Physical Review Letters, Oct. 2, 1972, vol. 29, No. 14, pp. 917-920.
Fonseca et al. "Ising field theory in a magnetic field: analytic properties of the free energy." Journal of Statistical Physics, vol. 110, No. 3-6, Dec. 19, 2001, 66 pages.
Fratila et al., "Small-Volume Nuclear Magnetic Resonance Spectroscopy," Annual Review of Analytical Chemistry, Jul. 2011, vol. 4, 227-249 (25 total pages).
Frerot et al., "Quantum Critical Metrology," Physical Review Letters, received Aug. 1, 2017, published Jul. 11, 2018, vol. 121, 6 pages.
Friedman, "Ising model with a transverse field in two dimensions: Phase diagram and critical properties from a real-space renormalization group." Physical Review B, Feb. 1, 1978, vol. 17, No. 3, pp. 1429-1432.
Glenn et al., "Micrometer-scale magnetic imaging of geological samples using a quantum diamond microscope." Geochemistry, Geophysics, Geosystems, published online Aug. 22, 2017, vol. 18, No. 8, pp. 3254-3267.
Gold, "Optimal binary sequences for spread spectrum multi-plexing (Corresp.)," IEEE Transactions on Information Theory, Oct. 4, 1967, vol. 13, Issue 4, pp. 619-621.
Grezes et al. "Multi-mode storage and retrieval of microwave fields in a spin ensemble," Physical Review A (2015) 92, 020301. arXiv: 1401.7939, Jan. 30, 2014. 20 pages.
Grinolds et al., "Subnanometre resolution in three-dimensional magnetic resonance imaging of individual dark spins," Nature Nanotechnology, Apr. 2014, vol. 9, pp. 279-284.
Grisi et al., "NMR spectroscopy of single sub-nL ova with inductive ultra-compact single-chip probes," Scientific Reports, Mar. 20, 2017, vol. 7, 8 pages.
Guitard et al., "Local nuclear magnetic resonance spectroscopy with giant magnetic resistance-based sensors," Applied Physics Letters, May 26, 2016, vol. 108, 5 pages.
Hahn, "Spin echoes." Physical Review, Nov. 15, 1950, vol. 80, No. 4, 22 pages.
Hauke et al., "Measuring multipartite entanglement via dynamic susceptibilities." Nature Physics, vol. 12, No. 8, Sep. 5, 2015, 11 pages.
Herzog et al., "Boundary between the thermal and statistical polarization regimes in a nuclear spin ensemble," Applied Physics Letters, Aug. 1, 2014, vol. 105(4), 6 pages.
Ho et al., "Critical time crystals in dipolar systems." Physical Review Letters, vol. 119, No. 1, Jul. 7, 2017, 9 pages.
Hosten et al., "Measurement noise 100 times lower than the quantum-projection limit using entangled atoms." Nature, Jan. 28, 2016, vol. 529, No. 7587, pp. 505-508 (7 total pages).
International Search Report and Written Opinion dated Aug. 24, 2017, in the International Application No. PCT/US17/35194, 14 pages.
International Search Report and Written Opinion dated Aug. 27, 2018, in the International Application No. PCT/US18/36197. 11 pages.
International Search Report and Written Opinion dated Mar. 6, 2018, in the International Application No. PCT/US17/34256. 14 pages.
Ishikawa et al., "Optical and Spin Coherence Properties of Nitrogen-Vacancy Centers Placed in a 100 nm Thick Isotopically Purified Diamond Layer," Nano Letters, Mar. 9, 2012, vol. 12, No. 4, pp. 2083-2087.

Jiang et al., "Repetitive Readout of a Single Electronic Sin via Quantum Logic with Nuclear Spin Ancillae," Science, Oct. 9, 2009, vol. 326, pp. 267-272 (28 total pages).
Jiang et al., "Universal dynamical decoupling of multiqubit states from environment." Physical Review A, Dec. 28, 2011, vol. 84, No. 6, 4 pages.
Khemani et al., "Phase structure of driven quantum systems." Physical Review Letters, Jun. 24, 2016, vol. 116, No. 25, pp. 250401-1 to 250401-6 (6 total pages).
Klimov et al., "Quantum entanglement at ambient conditions in a macroscopic solid-state spin ensemble," Science Advances, Nov. 20, 2015, vol. 1, No. 10, e1501015. pp. 1-7.
Knap et al., "Probing Real-Space and Time-Resolved Correlation Functions with Many-Body Ramsey Interferometry." Physical Review Letters, Oct. 4, 2013, vol. 111, No. 14, 6 pages.
Knowles et al., "Observing bulk diamond spin coherence in high-purity nanodiamonds," Nature Materials, (2014) 13(1). arXiv: 1310.1133, Oct. 3, 2013. 16 pages.
Koehl et al., "Resonant optical spectroscopy and coherent control of Cr4+ spin ensembles in SiC and GaN," Physical Review B (2017) 95, 035207. arXiv: 1608.08255, Aug. 29, 2016 (13 total pages).
Kolkowitz et al., "Gravitational wave detection with optical lattice atomic clocks." Physical Review D, Dec. 27, 2016, vol. 94, No. 12, 15 pages.
Kong et al., "Towards Chemical Structure Resolution with Nanoscale Nuclear Magnetic Resonance Spectroscopy," Physical Review Applied, Jun. 19, 2015, vol. 4, 024004. 6 pages.
Kucsko et al., "Critical thermalization of a disordered dipolar spin system in diamond," arXiv preprint, Sep. 26, 2016, arXiv:1609.08216 v1. 41 pages.
Kucsko et al., "Critical Thermalization of a Disordered Dipolar Spin System in Diamond," Physical Review Letters, submitted Sep. 26, 2016, arXiv: 1609.08216 v2. Oct. 25, 2017, 47 pages.
Kuo et al., "Quadratic dynamical decoupling: Universality proof and error analysis." Physical Review A, vol. 84, No. 4, Jun. 10, 2011, 18 pages.
Kuwahara et al., "Floquet-Magnus theory and generic transient dynamics in periodically driven many-body quantum systems." Annals of Physics, vol. 367, Feb. 12, 2016, 19 pages.
Lacey et al., "High-Resolution NMR Spectroscopy of Sample Volumes from 1 nL to 10 μL," Chemical Reviews, Sep. 16, 1999, vol. 99, pp. 3133-3152.
Lathi, Modern Digital and Analog Communication Systems, Third Edition, Oxford University Press, USA, Apr. 10, 1998, 554 pages.
Lazarides et al., "Fate of many-body localization under periodic driving." Physical Review Letters, Jul. 27, 2015, vol. 115, No. 3, 9 pages.
Le Sage et al., "Optical magnetic imaging of living cells," Nature, Apr. 25, 2013, vol. 496, pp. 486-489 (6 total pages).
Lovchinsky et al., "Magnetic resonance spectroscopy of an atomically thin material using a single-spin qubit." Science, Jan. 19, 2017, vol. 355, No. 6324, 18 pages.
Lovchinsky et al., "Nuclear magnetic resonance detection and spectroscopy of single proteins using quantum logic," Science, Feb. 19, 2016, vol. 351, Issue 6275, pp. 836-841 (7 total pages).
Macieszczak et al., "Dynamical phase transitions as a resource for quantum enhanced metrology." Physical Review A, Feb. 3, 2016, vol. 93, No. 2, 10 pages.
Maertz et al., "Vector magnetic field microscopy using nitrogen vacancy centers in diamond,". Applied Physics Letters, published online: Mar. 1, 2010, vol. 96, pp. 092504-1 to 092504-3 (4 total pages).
Maghrebi et al., "Causality and quantum criticality in long-range lattice models." Physical Review B, Mar. 17, 2016, vol. 93, No. 12, 18 pages.
Mamin et al., "Multipulse Double-Quantum Magnetometry with Near-Surface Nitrogen-Vacancy Centers," Physical Review Letters, (2014), vol. 113, 030803. arXiv: 1404.7480, Jul. 15, 2015. 33 pages.
Mamin et al., "Nanoscale Nuclear Magnetic Resonance with a Nitrogen-Vacancy Spin Sensor," Science, Feb. 1, 2013, vol. 339, pp. 557-560.

(56) References Cited

OTHER PUBLICATIONS

Maurer et al., "Room-temperature quantum bit memory exceeding one second." Science, Jun. 8, 2012, vol. 336, No. 6086, pp. 1283-1286 (5 total pages).

Maze et al., "Nanoscale magnetic sensing with an individual electronic spin in diamond," Nature, Oct. 2, 2008, vol. 455, No. 7213, pp. 644-647 (5 total pages).

Meriles et al., "Imaging mesoscopic nuclear spin noise with a diamond magnetometer," The Journal of Chemical Physics, Sep. 27, 2010, vol. 133(12), 10 pages.

Mori et al., "Rigorous bound on energy absorption and generic relaxation in periodically driven quantum systems." Physical Review Letters, vol. 116, No. 12, Mar. 17, 2017, 11 pages.

Mousoulis et al., "Single Cell Spectroscopy: Noninvasive measures of small-scale structure and function," Methods, Dec. 2013, vol. 64(2), pp. 119-128.

Nandkishore et al., "Many-body localization and thermalization in quantum statistical mechanics." Annual Review of Condensed Matter Physics, Mar. 2015, vol. 6, No. 1, pp. 1-38.

Olson et al., "High-Resolution Microcoil 1H-NMR for Mass-Limited, Nanoliter-vol. Samples," Science, Dec. 22, 1995, vol. 270, issue 5244. 6 pages.

Pfeuty et al. "The Ising model with a transverse field. II. Ground state properties." Journal of Physics C: Solid State Physics, Oct. 1971, vol. 4, No. 15, pp. 2370-2385 (17 total pages).

Pham et al., "Magnetic field imaging with nitrogen-vacancy ensembles" New Journal of Physics, Apr. 28, 2011, vol. 13, pp. 045021:1-13 (14 total pages).

Ponte et al., "Many-body localization in periodically driven systems." Physical Review Letters, vol. 114, No. 14, Oct. 30, 2014, 7 pages.

Popa et al., "Energy levels and decoherence properties of single electron and nuclear spins in a defect center in diamond". Physical Review B, Nov. 5, 2004, vol. 70, pp. 201203:1-4.

Rondin et al., "Magnetometry with nitrogen-vacancy defects in diamond," Reports on Progress in Physics, May 6, 2014, vol. 77, 056503, 26 pages.

Rosskopf, "Advanced quantum sensing using nitrogen vacancy centers in diamond," doctoral thesis submitted ETH Zurich, published 2016, 38 pages.

Savukov et al., "NMR detection with an atomic magnetometer," Physical Review Letters, Apr. 1, 2005, vol. 94(12), 4 pages.

Schreiber et al., "Observation of many-body localization of interacting fermions in a quasi-random optical lattice," Science, Jan. 22, 2015, vol. 349, No. 6250, p. 842-845 (14 total pages).

Serber et al., "In-Cell NMR Spectroscopy," Methods in Enzymology, Feb. 2005, vol. 394, pp. 17-41.

Shields et al., "Efficient Readout of a Single Spin State in Diamond via Spin-to-Charge Conversion," Physical Review Letters, Apr. 3, 2015, vol. 114(13), 5 pages.

Skotiniotis et al., "Quantum metrology for the (sing Hamiltonian with transverse magnetic field." New Journal of Physics, Jul. 31, 2015, vol. 17, No. 7, 12 pages.

Smith et al., "Many-body localization in a quantum simulator with programmable random disorder." Nature Physics, Oct. 2016, vol. 12, No. 10, pp. 907-911.

Staudacher et al., "Nuclear Magnetic Resonance Spectroscopy on a (5-Nanometer)3 Sample Volume," Science, Feb. 1, 2013, vol. 339, Issue 6119, pp. 561-563 (4 total pages).

Staudacher et al., "Probing molecular dynamics at the nanoscale via an individual paramagnetic centre," Nature Communications, Oct. 12, 2015, vol. 6, No. 8527, 7 pages.

Steinert et al., "High sensitivity magnetic imaging using an array of spins in diamond," Review of Scientic Instruments, published online: Apr. 23, 2010, vol. 81, article 043705, 13 pages.

Strobel et al., "Fisher information and entanglement of non-Gaussian spin states." Science, Jul. 25, 2014, vol. 345, No. 6195, pp. 424-427. (arXiv version Jul. 14, 2015) (11 total pages).

Taylor et al. "High-sensitivity diamond magnetometer with nanoscale resolution," Nature Physics, published online: Sep. 14, 2008, vol. 4, pp. 810-816.

Von Keyserlingk et al. "Absolute stability and spatiotemporal long-range order in Floquet systems." Physical Review B, Aug. 8, 2016, vol. 94, No. 8, 11 pages.

Walsh, "A Closed Set of Normal Orthogonal Functions," American Journal of Mathematics, Jan. 1923, vol. 45, No. 1, pp. 5-24 (21 total pages).

Walsworth et al., "Synchronized-Readout for narrowband detection of time-varying electromagnetic fields using solid state spins," Harvard Office of Technology Development, Mar. 27, 2017. 21 pages.

Wang et al. "An optogenetics- and imaging-assisted simultaneous multiple patch-clamp recording system for decoding complex neural circuits," Nature Protocols, Feb. 5, 2015, vol. 10, pp. 397-412 (30 total pages).

Waugh et al., "Approach to high-resolution NMR in solids." Physical Review Letters, Jan. 29, 1968, vol. 20, No. 5, 4 pages.

Yao et al., "Discrete Time Crystals: Rigidity, Criticality, and Realizations," Phys. Rev. Lett., Jan. 20, 2017, vol. 118, 6 pages.

Zaiser et al., "Enhancing quantum sensing sensitivity by a quantum memory," Nature Communications, vol. 7, Article No. 12279, Aug. 10, 2016, 11 pages.

Zanardi et al., "Quantum criticality as a resource for quantum estimation." Physical Review A, Oct. 9, 2008, vol. 78, No. 4, 7 pages.

Zhang et al., "Observation of a discrete time crystal." Nature, Mar. 9, 2017, vol. 543, No. 7644, pp. 217-220 (12 total pages).

Zurek et al., "Dynamics of a quantum phase transition." Physical Review Letters (2005) vol. 95, No. 10. arXiv Feb. 14, 2006, 4 pages.

\* cited by examiner

SYNCHRONIZED-READOUT FOR NARROWBAND DETECTION OF TIME-VARYING ELECTROMAGNETIC FIELDS USING SOLID STATE SPINS

CROSS REFERENCE TO RELATED APPLICATION

This application is a national phase application of PCT/US2017/034256, entitled SYNCHRONIZED-READOUT FOR NARROWBAND DETECTION OF TIME-VARYING ELECTROMAGNETIC FIELDS USING SOLID STATE SPINS, filed on May 24, 2017, which claims the benefit of U.S. Provisional Application 62/341,497 filed May 25, 2016, the contents of each of which are hereby incorporated by reference.

STATEMENT OF GOVERNMENT RIGHTS

This invention was made with government support under Grant No. HR-0011-11-C-0073 awarded by the Defense Advanced Research Projects Agency (DARPA). The government has certain rights in this invention.

BACKGROUND

Nuclear magnetic resonance (NMR) spectroscopy is an important analytical tool in modern chemistry, structural biology, and materials research. Conventional NMR relies on inductive detection and requires sample volumes of 0.1-1 mL, although alternative detection technologies including microcoils, superconducting quantum interference devices (SQUIDs), atomic magnetometers, and detectors based on solid state spins have been demonstrated to improve sensitivity or allow reduced sample volumes. Current spectral resolution for NMR detection using solid state spins (e.g., nitrogen vacancy centers in diamond) is considerably broader than the resolution needed to observe J-couplings or chemical shifts at typical static magnetic fields used in such NMR experiments, making existing detection techniques unsuitable for many practical molecular NMR applications.

Two key challenges limited the spectral resolution of nitrogen vacancy (NV)-detected NMR techniques demonstrated to date. First, the interrogation duration was set by the spin state lifetime of the NV ($T_1$~3 ms), or of a proximal solid-state nuclear spin used to create a quantum memory ($T_1$~5-50 ms), both of which are orders of magnitude shorter than typical coherence times of nuclear spins in liquid samples ($T_2$~1 s). Second, for NV-NMR with nanoscale sample volumes, the thermal spin magnetization at room temperature and $B_0$~0.1 T is small (~$3\times10^{-7}$ N, for N the number of spins in the volume) compared to statistical fluctuations in the net magnetization (which scale as $N^{1/2}$). All previous NV-NMR experiments therefore measured the spin-noise-induced variance in the local magnetic field, which is large enough detect easily ($\sigma_B$≈0.6 µT RMS for NV depth $d_{NV}$=5 nm below the diamond surface and a sample of pure water), but has short correlation time limited by diffusion of sample spins through the sensing volume (e.g., $\tau_c^{-1}$ 10 MHz for water or $\tau_c^{-1}$ 30 kHz for viscous oil, for a sensing volume V≈[5 nm]$^3$). Therefore, there is a need for systems and methods capable of narrow resolution for detecting time-varying electromagnetic fields.

SUMMARY OF THE INVENTION

In accordance with one aspect, the present application discloses systems and methods for higher resolution NMR detection using solid state spins, wherein a synchronized readout pulse sequence is utilized to allow coherent interrogation of sample nuclei over many measurements, and implementing this sequence in an instrument with sufficient sensitivity to measure the thermal spin polarization instead of statistical fluctuations.

In one aspect, a system includes a sensor, wherein the sensor includes a solid state electronic spin system disposed below the surface of the sensor, wherein the solid state electronic spin system has a spin-state dependent fluorescence; a source of light; a source of first external perturbation, wherein the source of first external perturbation generates a magnetic field; a source of second external perturbation; wherein, the source of light and the first and second external perturbations are configured to coherently and independently manipulate the spin states of at least one solid state electronic spin system; a digital timing generator configured to synchronize the light and the first and second perturbations; and a detector to optically measure the solid-state electronic spins spin-state dependent fluorescence.

In some embodiments, the sensor includes a high purity diamond crystal lattice. In some cases, the solid state electronic spin system is a nitrogen-vacancy (NV) spin in the high purity diamond lattice.

In some embodiments, the system further includes a source of third external perturbation such as a radio frequency (RF) electromagnetic field source or an electronic spin resonance (ESR) field source.

In some embodiments, the source of second external perturbation is a microwave field source.

In some embodiments, the detector is a CCD camera, or a photomultiplier, or a photodiode.

In some embodiments, the sample to be measured is placed on a surface of the sensor. In some aspects, the sample to be measured is placed in the proximity of the sensor.

In some embodiments, the digital timing generator is configured to provide a sub-sequence of pulses of the light and the second perturbation designed to be selective for detecting oscillating magnetic signals near a central frequency, f. In some cases, the sub-sequence of pulses has a duration that is an integer multiple of 1/f.

In some embodiments, the solid state spin systems spin-dependent fluorescence is changed due to the interaction with the sample.

In some embodiments, the source of light radiation is an optically pumped laser. In some cases, the optically pumped laser has a wavelength of 532 nm.

In accordance with another aspect, a method of measuring an oscillating magnetic field includes disposing a sensor in a first external perturbation field, wherein the sensor includes a solid state electronic spin system disposed below the surface of a sensor and the solid state electronic spin system is aligned with the first external perturbation field, wherein the solid state electronic spin system has a spin-state dependent fluorescence; positioning the sensor in proximity to a sample containing a source of oscillating magnetic fields; obtaining a sequence of fluorescence intensity measurements by i) pulsing a light source to generate light to align spins of the solid state electronic spin system; ii) pulsing a source of second external perturbation; and iii) detecting fluorescence of the solid state electronic spin system; wherein steps i) and ii) in each iteration are synchronized using a digital timing generator; and repeating steps i), ii) and iii) for a predetermined number of iterations.

In some embodiments, obtaining a sequence of fluorescent intensity measurements further comprises iv) pulsing a source of third external perturbation. In some aspects, the source of third external perturbation includes a radio frequency (RF) electromagnetic field source or an electronic spin resonance (ESR) field source.

In some embodiments, the method further includes applying a Fourier transform to the sequence of fluorescent intensity measurements that were recorded at equal time intervals during each iteration.

In some embodiments, the sensor includes a high purity diamond crystal lattice. In some cases, the solid state electronic spin system is a nitrogen-vacancy (NV) spin in the high purity diamond lattice.

In some embodiments, the source of second external perturbation is a microwave field source.

In some embodiments, the digital timing generator is configured to provide a sub-sequence of pulses of the light and the second perturbation designed to be selective for detecting oscillating magnetic signals near a central frequency, f. In some aspects, the sub-sequence of pulses has a duration that is an integer multiple of 1/f.

In some embodiments, the sample comprises a liquid sample. In some aspects, the liquid sample volume is between about 10 to 100 pL.

BRIEF DESCRIPTION OF THE DRAWINGS

The following figures are provided for the purpose of illustration only and are not intended to be limiting.

FIGS. 4A-4C show the measured SR spectral resolution using signals from a coil antenna.

DETAILED DESCRIPTION

A method and device for magnetic resonance imaging with high resolution and sensitivity under ambient conditions is described.

Figure 1:
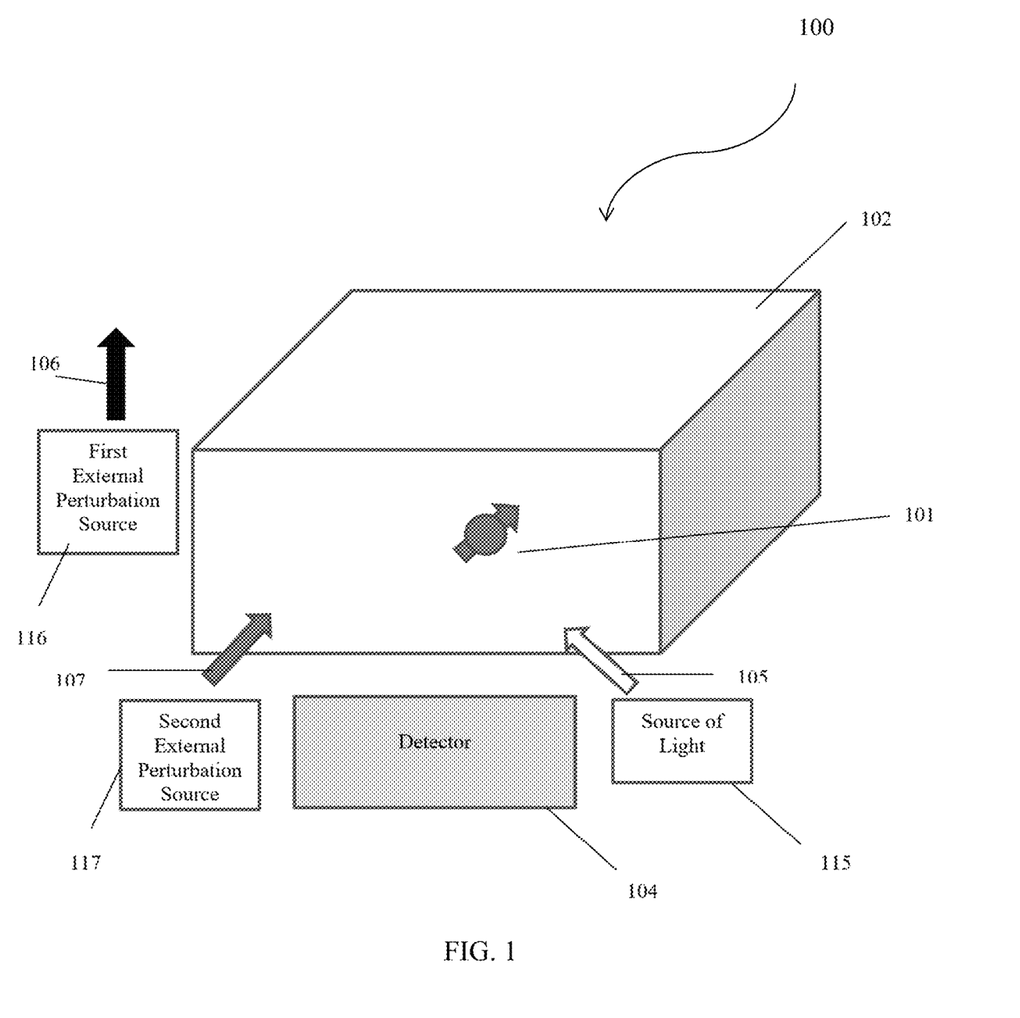
FIG. 1 is a schematic block diagram of a solid state magnetometer including a single NV center, in accordance with one embodiment of the present disclosure.

FIG. 1 is a schematic showing a solid state electronic spin system having spin-dependent fluorescence 101 in a sensor 100, located below the surface 102 of the sensor 100. The schematic also shows a detector 104 used to measure the changes in the solid-state electronic spin in response to light 105, a first external perturbation 106 and a second external perturbation 107 originating from the source of light 115, a first external perturbation source 116, and a second external perturbation 117, respectively.

The light 105 generated from the source of light 115, when applied to the solid state electronic spin system 101, causes the electronic spin or spins to align along one or more well-defined directions. In some embodiments, the source of light 115 is a laser. In an exemplary embodiment, the laser may generate light 105 that has a wavelength of about 532 nm and has green color.

The first external perturbation 106 originating from the first external perturbation source 116 is applied to the solid state electronic spin 101 and causes a detectable splitting in the electronic spin energy level, i.e., causes a detectable Zeeman shift. In some embodiments, the first external perturbation source 116 is a permanent magnet, or a current-carrying coil, and the first external perturbation 106 is a static magnetic field.

A second external perturbation 107 originating from the second external perturbation source 117 is applied to the solid state electronic spin 101 and causes controllable flipping or rotation of the electronic spin. In some embodiments, the external perturbation 107 is a sequence of pulses of microwave radiation and the second external perturbation source 117 is a microwave field generator. As used herein, microwave radiation is used as the drive field for solid state electronic spins. It is typically 100 MHz-10 GHz in frequency, depending on the magnitude of the bias magnetic field.

In accordance with certain aspects of the present invention, additional external perturbations may be applied to the system. For example, a third external perturbation originating from a third external perturbation source may be applied to the sample or source of oscillating magnetic fields to be measured to manipulate the nuclear spins. In some embodiments, the third external perturbation is a sequence of pulses of RF radiation and the third external perturbation source is an RF field generator. In some other embodiments, the third external perturbation is an electronic spin resonance (ESR) field. Radio-frequency radiation is used as the drive field for nuclear spins comprising the sample. It is typically 1 MHz-100 MHz in frequency, depending on the magnitude of the bias magnetic field.

In an aspect, the sensing device can provide information regarding a target material of interest. By way of example, when an individual nuclear (e.g., proton) spin or collection of nuclear spins, such as a can be found in a protein molecule, is placed on the surface of the sensor, the nuclear spin interacts with the solid state electronic spins of the solid-state electronic spin system. The changes detected in the spin-state dependent fluorescence of the solid-state electronic spins can be used for sensing, coherent coupling and imaging the nuclear spin with high resolution. Although the applications apparent to one skilled in the art are innumerable, a non-limiting set of example applications that this approach enables is direct structural imaging of complex molecules that cannot be accessed from bulk studies, a new platform for probing novel materials, monitoring chemical reactions, and manipulation of complex systems on surfaces at a quantum level.

In some embodiments, the sensor is a high purity diamond. In some other embodiments, the solid state electronic spin system is a NV spin. The NV spin is found as a defect in the lattice structure of a single crystal diamond. The NV impurity is based in the lattice of carbon atoms, where two adjacent sites are altered, because one carbon atom is replaced with a nitrogen atom and the other space is left vacant. The vacancies may interact with interstitial atoms, such as nitrogen, and may act as color centers by absorbing visible light. NV spins are visible as red spots when illuminated by laser. In some embodiments, the proximal NV spin is located about 1 nm to 50 nm below the diamond surface. In some other embodiments, the NV spin is located at about 2 to 50 nm, or 2 to 30 nm, below the diamond surface. In accordance with certain embodiments, an ensemble of NV spins located 0-10 μm below the diamond surface is used.

In some embodiments, the method and device describe magnetic sensing and imaging for narrowband detection of periodically time-varying electromagnetic fields, through coherent manipulation of an electronic spin impurity, including an ensemble of spin impurities. In particular, the technique works by concatenating a series of individually quantum-coherent spin echo or dynamical decoupling sub-sequences applied to the electronic spin, interspersed with quantum measurements of the electronic spin state that give partial information about the sensed field. The full concatenated sequence is synchronized to a digital timing generator (a timing source used to synchronize all pulses during the full loop, e.g., external clock), such that the individual spin echo or dynamical decoupling sub-sequences are all in phase with each other at the carrier frequency, even though the quantum coherence of the electronic spin is disrupted by the interspersed measurements. One aspect of the present invention is the synchronization of the individual sub-sequences to form a full concatenated sequence, which provides spectral resolution of the detected field proportional to the inverse duration of the full concatenated sequence, while still allowing sensitivity to fields over a bandwidth proportional to the inverse duration of the spin echo or dynamical decoupling sub-sequences. In accordance with certain aspects, the present invention realizes NV spectral resolution <1 Hz to periodically time-varying electromagnetic fields. A particular application of the present invention is the detection of nuclear magnetic resonance (NMR) signals produced by samples placed directly on the diamond surface, for the purposes of spectroscopic molecular identification.

Figure 2:
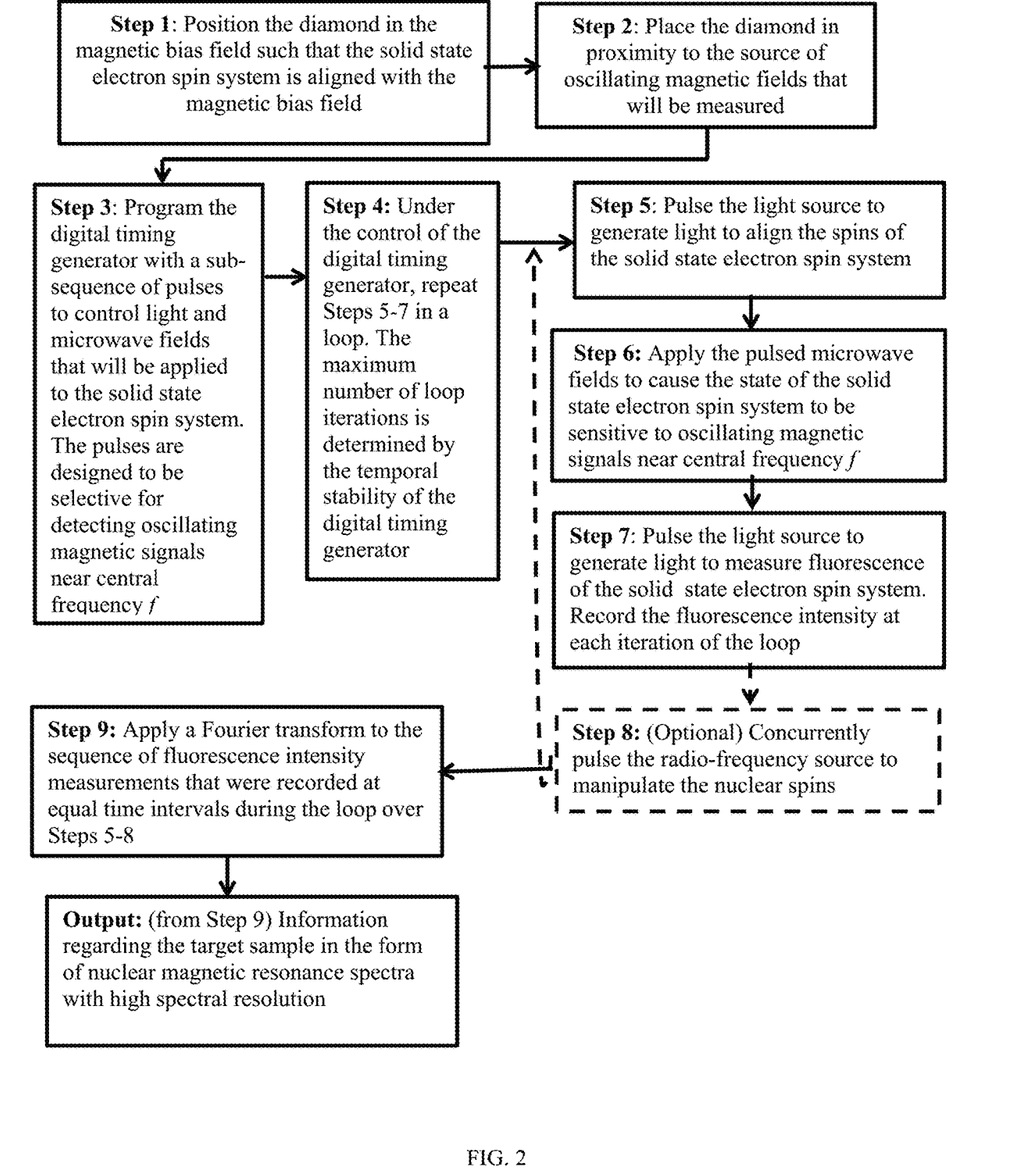
FIG. 2 is a flow chart of steps for analysis of an oscillating magnetic field in accordance with one embodiment.

FIG. 2 is a flow chart of steps in accordance with one aspect for analysis of a sample or other source of oscillating magnetic fields in the proximity of a sensor. Step 1 comprises cleaning the surface of the diamond and positioning the diamond in the magnetic bias field such that the solid state electron spin system is aligned with the magnetic bias field. In some embodiments, cleaning is achieved using a 3 acid treatment described elsewhere in this specification. This is followed by Step 2, which comprises placing the diamond in proximity to the source of oscillating magnetic fields that will be measured, more specifically in certain embodiment this step comprises providing a source of nuclear spins on the surface of the diamond. Step 3 comprises programming a digital timing generator with a sub-sequence of pulses to control light and microwave fields that will be applied to the solid state electron spin system. The pulses are designed to be selective for detecting oscillating magnetic signals near central frequency f. The duration of the sub-sequence is an exact integer multiple of 1/f. In Step 4, the digital timing generator is utilized to control Steps 5-7, which are repeated in a loop. The maximum number of loop iterations may be determined by the temporal stability of the digital timing generator. Step 5 comprises pulsing the light source to generate light to align the spins of the solid state electron spin system. Step 6 involves the application of pulsed microwave fields to cause the state of the solid state electron spin system to be sensitive to oscillating magnetic signals near central frequency f. Step 7 comprises pulsing the light source to generate light to measure fluorescence of the solid state electron spin system and recording the fluorescence intensity at each iteration of the loop. In accordance with certain embodiments, optional Step 8 comprises concurrently pulsing the radio-frequency source to manipulate the nuclear spins. These pulses are applied at defined intervals in the loop, but need not be applied at each iteration. In accordance with Step 9, a Fourier transform is applied to the sequence of fluorescence intensity measurements that were recorded at equal time intervals during the loop over Steps 5-8. Step 9 provides information regarding the target sample in the form of nuclear magnetic resonance spectra with high spectral resolution.

In accordance with some aspects, steps 4-9 may be repeated, and the outputs from each repetition averaged together, to improve sensitivity to small signals. The repetitions can occur with any desired delay from one repetition to the next (i.e., they need not be synchronized to each other).

Experimental

Diamond Samples:

The diamond used to construct the NV NMR sensor was a 2 mm×2 mm×0.5 mm high-purity chemical vapor deposition (CVD) diamond chip, with 99.999% 12C isotopic purity, and bulk nitrogen concentration $[^{14}N]<8.5\times10^{14}$ cm$^{-3}$ (Element Six). Modification of the CVD gas mix during the final stage of growth yielded a 13 μm thick nitrogen-enriched top layer ($[^{14}N]\approx4.8\times10^{18}$ cm$^{-3}$, measured by secondary ion mass spectrometry). The diamond was electron-irradiated ($1.3\times10^{14}$ cm$^{-2}$ s$^{-1}$ flux) for 5 hours, and annealed in vacuum (800° C.) for 12 hours, yielding an NV concentration $[NV]\approx3\times10^{17}$ cm$^{-3}$. The diamond was cut such that the top face was perpendicular to the [100] crystal axis, and the lateral faces were perpendicular to [110]. All four edges of the top face were then polished through at 45° (Delaware Diamond Knives), resulting in a truncated square pyramid, with top face area 1 mm×1 mm. The ensemble $T_2^*$ dephasing time for NV centers in this diamond, measured using Ramsey spectroscopy, was $T_2^*\approx750$ ns. The ensemble $T_2$ decoherence time, measured using a Hahn-echo sequence, was 6.5 μs.

The diamond used for NV ensemble sensing of antenna signals (FIGS. 3B-3C) was identical to the NV NMR sensor chip, but without angle-polished edges. The diamond used in single NV experiments was a 4 mm×4 mm×0.5 mm high-purity CVD diamond chip, with 99.99% $^{12}C$ isotopic purity near the surface, which contained preferentially oriented NV centers with nitrogen concentration [$^{14}$N]≈1×10$^{15}$ cm$^{-3}$ and NV concentration [NV]≈3×10$^{12}$ cm$^{-3}$. The approximate coherence times for the single NV center used in our experiments were T1≈1 ms, T2≈500 µs, and T2*≈50 µs.

Single-NV Sensor:

The single-NV sensor was based on a low NV density diamond chip, as described above. The antenna-generated magnetic signals were measured using a home-built scanning laser microscopy system. Confocal scanning of the diamond chip was done by a three-axis motorized stage (Micos GmbH). A 400 mW, 532 nm diode-pumped solid state laser (Changchun New Industries) was used as an excitation light, and an acousto-optic modulator (Isomet Corporation) operated at 80 MHz was used to time-gate the laser. An oil-immersion objective (100×, 1.3 NA, Nikon CFI Plan Fluor) focused the green laser pulses onto a single NV center. Red fluorescence from the NV centers was collected by a silicon avalanche photodetector (Perkin Elmer SPCM-ARQH-12) through a 75 µm sized pinhole. The NV spin initialization and readout pulses were 3 µs and 0.5 µs, respectively. For the single-NV magnetometry, microwave pulses were applied to NV centers through nanofabricated 20 µm gapped waveguide, and the pulse sequence was generated using a GHz range signal source (Agilent E4428C), which was I/Q modulated by an AWG (Tektronix 5014c) for the microwave phase control.

NV Ensemble Sensor:

The NV ensemble sensor was based on a diamond chip with 13 µm NV-enriched surface layer, as described above. For detecting antenna-generated magnetic signals, the diamond chip was rectangular. For NMR sensing, an angle-polished chip was employed instead, allowing total internal reflection of the laser beam (FIG. 5A) to prevent direct illumination of the NMR sample. Excitation light was provided by a diode-pumped solid state laser at 532 nm (Coherent Verdi G7), directed through an acousto-optic modulator (AOM) (IntraAction ASM802B47) to produce 5 µs pulses. The first ~1 µs of each pulse was used to optically read the spin state of the NV ensemble, while the remainder of the pulse repolarized the NVs. The AOM was driven by a digitally synthesized 80 MHz sinusoid (Tektronix AWG 7122C), amplified to 33 dBm (Minicircuits ZHL-03-5WF), and the total laser power at the sensor volume was 150 mW. The laser was focused to a 20 µm diameter waist near the position of the NV sensor layer, resulting in an optical intensity 48 kW/cm$^2$ (comparable to the NV saturation intensity of 100 kW/cm$^2$).

For detection of antenna magnetic signals, the diamond was mounted on a glass slide; for NMR detection, it was glued (Epoxy Technology Inc., EPO-TEK 301) to a 3 mm glass prism (Thorlabs PS905) and placed inside a sample cuvette (FireflySci Type4 Microfluorescence Cuvette). In both cases, the diamond was carefully rotated such that a [111] diamond crystal axis was aligned to the static magnetic field $B_0$. NV centers aligned along this axis were used for sensing, while those along the other three [111] directions were far off-resonance and contributed only to the background fluorescence. The alignment was carried out by overlapping the pulsed electron spin resonance (ESR) frequencies of the 3 non-aligned axes. The static magnetic field strength was $B_0$=88 millitesla, such that the resonance frequency of the $|m_s=0\rangle \rightarrow |m_s=-1\rangle$ spin transition for the aligned NV centers was $f_{Larmor}$=400 MHz. (The $|m_s=0\rangle \rightarrow |m_s=+1\rangle$ resonance frequency was 5340 MHz.)

The NV magnetometry pulse sequences for magnetic resonance detection were carried out on the $|m_s=0\rangle \rightarrow |m_s=-1\rangle$ transition. Microwaves were delivered using a straight length of wire (0.25 mm diameter) above the diamond, approximately 0.4 mm away from the NV sensing volume. Both the 400 MHz carrier frequency and the pulse modulation were synthesized digitally (Tektronix AWG 7122C); pulses were then amplified to 40 dBm (Minicircuits ZHL-100W-52-S+) and coupled into the wire, yielding NV Rabi frequency $\Omega$=8.3 MHz. An XY8-6 dynamical decoupling sequence was used to selectively detect magnetic resonance signals around 3.755 MHz, the which is the proton Larmor frequency at $B_0$=88 millitesla. The phase of the final $\pi/2$ pulse of the sequence was optimized to give fluorescence corresponding to a mixed state of the NV (i.e. equal to the mean fluorescence over one Rabi oscillation), to make the fluorescence signal linearly sensitive to small magnetic field amplitudes. For an ideal two-level quantum system, this condition would correspond to a 90° phase shift between the initial and final $\pi/2$ pulses; in practice, small drive detunings associated with $^{14}$NV hyperfine structure required manual optimization of the phase. To reject laser intensity noise and microwave power fluctuations, the phase of the final $\pi/2$ pulse of every second SR magnetometry subsequence was shifted by 180° relative to the nominal value, and successive pairs of readouts were amplitude-subtracted. Thus, one SR time-series data point was recorded for every two magnetometry subsequences.

Spin state-dependent fluorescence from the NV centers was collected with a quartz light guide (Edmund Optics 5 mm Aperture, 120 mm L, Low NA Hexagonal Light Pipe) and delivered to a balanced photodiode module (Thorlabs PDB210A). To eliminate scatter from the excitation laser, an interference filter (Semrock BLP01-647R) was placed between the light guide and detector. A small fraction of the excitation beam was split off upstream of the diamond chip and directed onto the second channel of the balanced diode module. A glass slide mounted on a motorized stage (Thorlabs PRM1Z8) in the second path allowed automated rebalancing between averages during long SR signal acquisitions. When the NV centers were fully polarized in $|m_s=0\rangle$, the light-induced fluorescence signal produced a single-channel (unbalanced) photocurrent of 30 µA. Immediately after applying a microwave $\pi$ pulse, the single-channel photocurrent was 28 µA, indicating a maximum fluorescence contrast of ~7%. The difference signal of the photo-diode module (with onboard transimpedance gain 1.75×10$^5$ V/A) was further amplified by 3 dB and low-pass filtered at 1 MHz using a low-noise pre-amplifier unit (Stanford Research SR-560), then recorded with a digital to analog converter (DAQ) (National Instruments NI-USB 6281). The DAQ bandwidth was 750 kHz, and the digitization was on-demand, triggered by a TTL pulse from the AWG used to control the experiment. The delay between the rising edges of the AOM gate pulse and the DAQ trigger was 1.9 µs, optimized for maximum spin state-dependent fluorescence contrast.

Figure 6A:
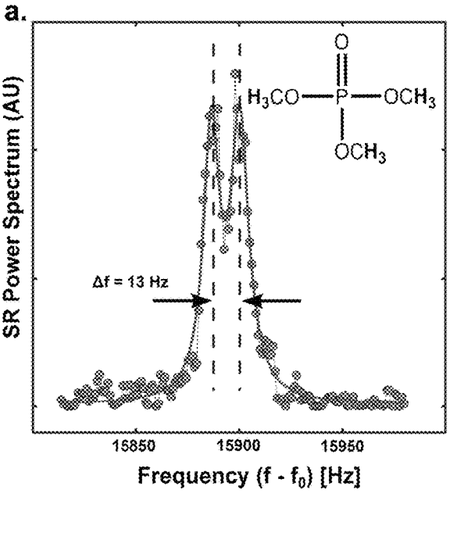
FIG. 6A shows an SR-FID spectrum of xylene (circles), acquired using the SR protocol with XY8-6 magnetometry subsequences, and $\tau_{SR}$=24 μs and n=4×10$^4$. Fitting to a sum of two Lorentzian lineshapes (solid line) indicates a splitting Δf=13±1 Hz due to J-coupling between the central $^{31}$P nucleus and the methyl protons.
Figure 6B:
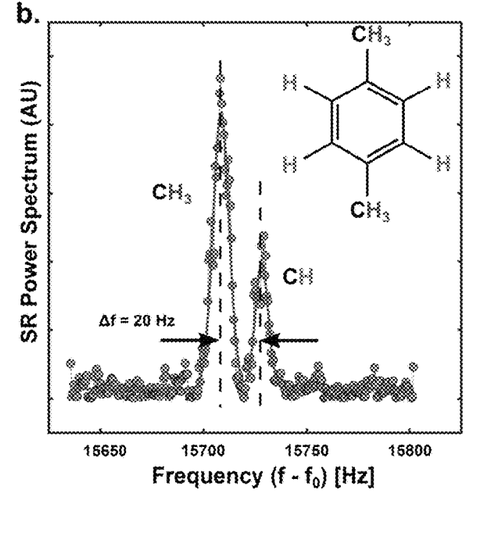
FIG. 6B shows an SR-FID spectrum of trimethyl phosphate (circles), acquired using SR with XY8-6 subsequences, and $\tau_{SR}$=24 μs and n=4×10$^4$. The relative peak heights obtained from fits to a sum of Gaussian lineshapes (solid lines) are due to the relative abundances of CH and CH$_3$ protons in the molecule, and the splitting Δf=20±2 Hz is the result of chemical shifts associated with the two proton positions.

SR Protocol Synchronization and Data Analysis:

The SR cycle period $\tau_{SR}$=24.06 µs, the reciprocal central SR detection frequency, $f_0^{-1}$=1/(3.74065 MHz)=267.3 ns, and the reciprocal NV drive frequency, $f_{Larmor}^{-1}$=1/(400 MHz)=2.5 ns, were all chosen to be exact integer multiples of the clock period of the timing generator (Tektronix AWG 7122C), $\tau_{Clock}$=(1/12 GHz)=0.083 ns. The ultimate frequency resolution of the experiment was therefore determined by the stability of this clock. The NV magnetometry pulse sequence (XY8-6 in all experiments, unless otherwise specified) was saved in the memory of the AWG and its output was gated by a TTL signal from a programmable pulse generator (Spincore PulseBlasterESR-PRO 500 MHz). The PulseBlaster gate duration was used to specify n, the number of SR iterations per experiment. For detecting the NMR signals, the pulse blaster also generated the TTL pulse for gating the proton driving MW pulses. Each readout of the SR protocol was saved in a numerical array, giving a time series of length n. Individual time series were averaged (in the time domain) to improve SNR. The first 20 SR time series data points, which coincided with the proton pulse $\pi/2$ pulse plus approximately 50 times the coil ringdown time, were discarded. The averaged time series data were then mean-subtracted before taking the Fourier transformation and fitting using Matlab. Each spectrum was fit to both Lorentzian and Gaussian lineshapes, and the model with smaller residuals (always Lorentzian, except in the case of FIG. 6B) was selected for display. Unless otherwise specified, all spectra shown in the figures are power spectra, calculated as the absolute value of the Fourier-transformed time series data. When uncertainties are quoted for spectral linewidth or splitting parameters, these uncertainties were estimated by repeating the full experiment and fitting procedure several times, then calculating the standard deviation over the ensemble of fitted parameters.

Electromagnet:

The bias magnetic field $B_0$ was produced by an air-cooled electromagnet (Newport Instruments Type A). The pole pieces were cylindrical, 10 cm in diameter, with adjustable gap set to 3 cm. The main coils (each 1900 turns of copper strip, with room-temperature resistance $R=4.5\Omega$) were driven (Hewlett Packard HP 6274) with a continuous current of ~650 mA to produce a nominal field $B_0 \approx 88$ millitesla. A secondary coil pair (diameter 10 cm, gap 7 cm, 15 turns each) were manually wound around the poles to allow precise field stabilization without the need for very small adjustments to main current supply. The secondary coils were driven by a voltage-controlled current supply (Thorlabs LDC205C), controlled by the analog output channel of a DAQ (National Instruments PCI 6036E). The field strength was monitored using continuous wave electron spin resonance (cwESR) measurements on a secondary diamond chip, spatially separated from the main sensor by ~1 cm. The cwESR microwave frequency modulation was synchronized to the main SR experiment using the same AWG (Tektronix AWG 7122C), to ensure that any cross-talk between the detectors was coherent over averages of the SR protocol and could be removed during data analysis. (This precaution proved unnecessary in the final experiments, as the cwESR drive power was too weak to produce a measurable effect on the SR sensor.) The excitation laser, light collection optics, and microwave drive for the secondary experiment were all independent from those of the main SR magnetic resonance sensor. This enabled feedback control over magnetic field fluctuations (primarily due to current noise in the main coils) with bandwidth ~12.5 Hz, resulting in short-term (~30 minutes) field stability $\sigma_B \approx 30$ nT RMS. To correct slow drifts between the main magnetic resonance sensor and the secondary field-stabilization sensor, we periodically (every 5 minutes) paused the SR protocol between averages and performed pulsed ESR measurements on the primary diamond. Any measured magnetic field drifts were used to correct the setpoint of the fast feedback loop, ensuring long-term (~50 hours) stability $\sigma_B \approx 50$ nT RMS. All cwESR measurements were carried out using both the $|m_s=0\rangle \rightarrow |m_s=-1\rangle$ and the $|m_s=0\rangle \rightarrow |m_s=+1\rangle$ transitions of the aligned NV centers, to distinguish resonance shifts due to changes in temperature and magnetic field. For fast feedback measurements on the secondary sensor, only 4 discrete ODMR frequencies were monitored to maximize bandwidth. This system was potentially susceptible to second-order feedback errors associated with simultaneous changes in $B_0$ and temperature. Therefore, the secondary sensor was thermally anchored to a piece of black-anodized aluminum and its temperature actively stabilized using absorption from a separate DPSS laser (Thorlabs DJ532-40). Temperature control was not required for slow feedback on the main magnetic resonance sensor, where a full ODMR spectrum (58 frequency points) was acquired to fully account for all drifts in magnetic field, temperature, and optical contrast.

NMR Drive Coils:

Radio frequency (RF) pulses for driving sample protons (e.g., with a $\pi/2$-pulse at the start of an SR-FID experiment) were produced by a pair of solenoid coils wound around the sample cuvette. This geometry, with 1.1 cm coil diameter and 1.2 cm center-to-center spacing, provided a combination of strong drive fields and convenient optical access to the NV ensemble sensor. The coils were 24 turns each, connected in series and coupled to the current source (Rigol DG 1032) with a standard network of variable matching and coupling capacitors. After tuning, the resonance frequency was 3.75 MHz, and the coil Q was 140. Driving the coils on resonance, a maximum nuclear Rabi frequency $\Omega=2.8$ kHz was obtained.

In accordance with one aspect, a synchronized readout (SR) technique is used to coherently measure oscillating magnetic signals (e.g., the free induction decay (FID) in liquid-state NMR) for a duration greatly exceeding the $T_2$ coherence time of the NV. The SR protocol (FIGS. 3A-3C) includes a series of concatenated NV magnetometry sub-sequences, interspersed with projective NV spin state readouts, all synchronized to an external clock. The protocol is defined with respect to a particular central frequency $f_0$. The magnetometry sub-sequences are all identical, each comprising an initial $\pi/2$ pulse, followed by a train of $\pi$ pulses applied at a rate of $2f_0$, and ending with another $\pi/2$ pulse. The initial and final $\pi/2$ pulses are chosen to be 90° out of phase, such that the final NV spin population is linearly dependent on the amplitude of the oscillating magnetic field signal. This is different from previous NV-detected NMR protocols, where magnetometry pulse sequences yielded a quadratic dependence of the final NV state on the magnetic field signal in order to sense statistical fluctuations in the sample magnetization. At every SR readout step, the accumulated NV spin population is measured via spin-state-dependent fluorescence, and the NV spin is repolarized.

Figure 3A:
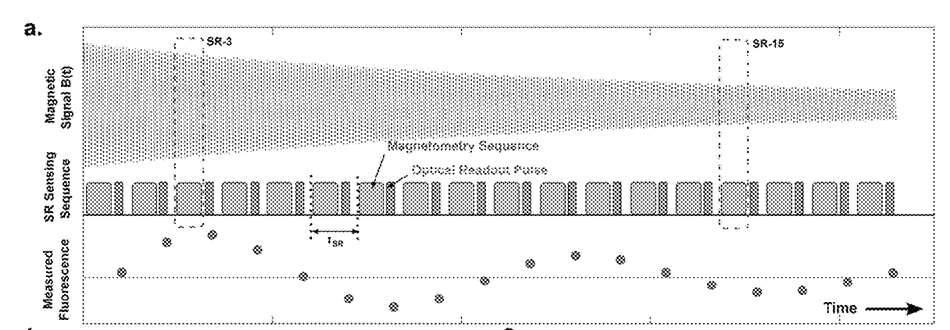
FIG. 3A is a numerical stimulation of synchronized readout (SR) detection of a free induction decay (FID) signal, which oscillates at frequency f and has finite decay lifetime τ.
Figure 3B:
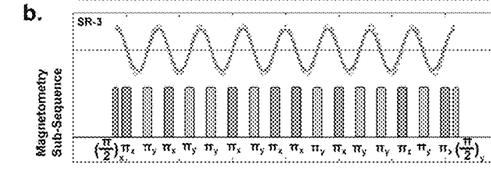
FIGS. 3B-3C shows detail of calculated magnetic signal and magnetometry subsequence at the third SR iteration (denoted SR-3) of the simulation in FIG. 3A.
Figure 3C:
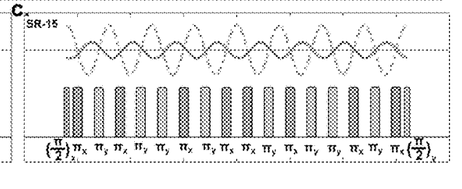

The delay between the start of successive magnetometry sub-sequences in the SR protocol is an integer number of periods at the central frequency, $\tau_{SR}=k/f_0$. Thus, a magnetic signal at $f_0$ produces exactly the same NV phase accumulation during each repetition of the sub-sequence, and the mean NV fluorescence intensity is the same at each readout step. By contrast, a magnetic signal that is slightly detuned from the central frequency, $f=f_0+\delta f$, is advanced in phase at the start of each SR iteration by $\delta\phi=\tau_{SR}\delta f$. In this case, the mean NV fluorescence changes at every readout, and the time series of readouts will oscillate at frequency $\delta f$. In effect, the SR protocol mixes down the magnetic signal by $f_0$. The frequency resolution of the fluorescence time series data is set by the total duration of the SR protocol and is therefore limited, in principle, only by the stability of the external clock. The range of signal frequencies f that can be detected without aliasing is given by $1/(2\tau_{SR})$. One condition for the successful application of the SR technique, which is not necessarily satisfied in other NV-detected NMR protocols, is that the NV should be weakly coupled to the magnetic signal source to avoid line broadening due to back-action at each SR measurement iteration.

Figure 4A:
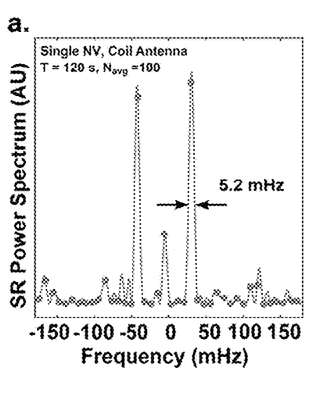
FIG. 4A is a plot of the power spectrum of SR signal obtained with a single-NV magnetic sensor in a confocal microscope.

In accordance with an exemplary embodiment, the SR technique was applied to a magnetic sensor including a single NV center, imaged in a confocal microscope (FIG. 4A). A nearby coil antenna was excited continuously (without gating or triggering of the sources) to produce a magnetic signal consisting of three closely-spaced frequencies around 3.7325 MHz; and the SR protocol was performed at a central frequency $f_0=3.7313$ MHz (period 268 ns). Magnetometry was carried out using an CPMG-32 dynamical decoupling sequence; the SR cycle period was $\tau_{SR}=75.04$ μs; and the total experiment duration was $T=n\,\tau_{SR}=112.5$ s, for $n=1.5\times10^6$ the number of readouts. The signal strength was tuned such that magnetic field amplitude at the NV center was ~3 μT, corresponding to the maximum fluorescence contrast for a single CPMG-32 sequence. Due to finite optical collection efficiency, each SR fluorescence readout detected a mean of only ~0.03 photons. The SR protocol was repeated 100 times, and a periodogram was constructed from the full data set. In the resulting power spectrum, the three signal peaks were clearly distinguishable, and the spectral resolution was 5.2 mHz (FWHM).

Figure 4B:
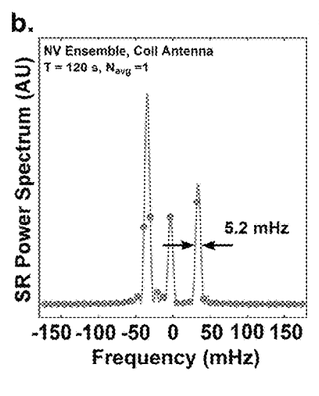
FIG. 4B is a plot of the power spectrum of SR signal obtained with an NV ensemble magnetic sensor for a single average for a duration of T=112.5 s.
Figure 4C:
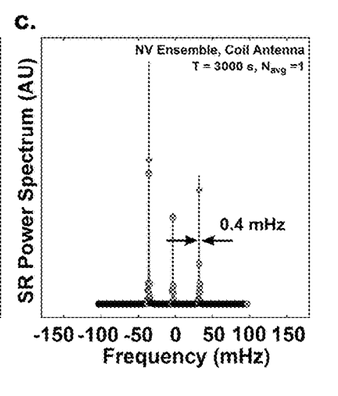
FIG. 4C is a plot of the power spectrum of SR signal obtained with a NV ensemble magnetic sensor for a single average for a duration of T=3000 s.

To improve sensitivity and eliminate the need for signal averaging, the same measurement was repeated using an NV ensemble magnetic sensor that integrates fluorescence from a total of ~5×10$^8$ NV centers. A spectral resolution of 5.2 mHz (FWHM) was observed again, this time in a single SR experiment without averaging (FIG. 4B). The SR protocol duration was extended to $T=3\times10^3$ s, using $\tau_{SR}=1.2$ ms and $n=2.5\times10^6$, and linewidths of 0.4 mHz (FIG. 4C) were recorded, again without averaging. This spectral resolution was approximately 5 orders of magnitude narrower than previously demonstrated for non-SR magnetic signal detection using NV centers, and was likely limited by pulse timing jitter and/or oscillator phase noise in the waveform generator used to synthesize the SR magnetometry subsequences.

Detection of magnetic resonance signals with high spectral resolution using the SR technique requires long sample coherence times. Because molecular diffusion necessarily limits the correlation times of magnetic noise in nanoscale samples, larger volumes were used such that the mean thermal magnetization, $M_z$, is greater than the distribution width of statistical fluctuations in the magnetization, $\sigma_M$. The sample temperature and the magnitude of the static magnetic field $B_0$ determine the thermal polarization, and hence the minimum detection volume. For experimental convenience in driving magnetometry pulse sequences at the NV Larmor frequency, testing was typically conducted at $B_0=88$ millitesla. Then, taking protons in water as a characteristic sample, the condition $M_z>\sigma_M$ sets a lower bound on the detection volume, $$V > \left(\frac{2k_B T}{\gamma_p B_0}\right)^2 \frac{1}{\rho_p} \approx (9\ \mu m)^3.$$

Here $\gamma_p=1.41\times10^{-26}$ J/T is the proton magnetic moment, $k_B=1.38\times10^{-23}$ J/K is Boltzmann's constant, $T=300$ K is the temperature, and $\rho_p=6.7\times10^{28}$/m$^3$ is the density of protons in water.

Figure 5A:
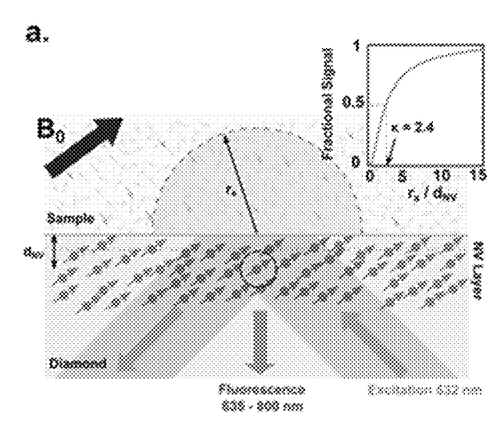
FIG. 5A provides an NV ensemble sensor for SR-detection of proton NMR.

An NV ensemble magnetic sensor was constructed, which was designed to detect NMR signals due to the thermal sample magnetization (FIG. 5A). The sensing volume included the overlap region between a 13 μm thick NV-doped layer (NV density $2\times10^{17}$ cm$^{-3}$) at the diamond surface, and the ~10 μm diameter waist of the optical excitation beam, which was totally internally reflected off the diamond surface at an angle of ~45°. Applying a sinusoidal magnetic test signal from a nearby coil antenna at f=3.742 MHz, an SR sensitivity was measured (using $f_0=3.74066$ MHz) of 50 pT/Hz$^{1/2}$. By comparison, the expected signal size due to a large sample [V>>(9 μm)$^3$] of protons in water is ~81 pT.

To motivate this choice of sensor geometry, a single NV center, located a depth d below the diamond surface, and a sample consisting of a half-space of Larmor-precessing spins (density $\rho_p=6.7\times10^{28}$/m$^3$) above the surface are considered. Comparing the standard deviation of magnetic field fluctuations at the position of the NV, $\sigma_B$, to the mean magnetic field due to the sample magnetization, $\overline{B}$, one can determine that the condition for the latter to dominate is $d_{NV} \gtrsim 3$ μm. (Note that both $\sigma_B$ and $\overline{B}$ are obtained by projecting the magnetic field onto the dipole axis of the NV, which has been aligned parallel to the direction of $B_0$.) On the other hand, the effective detection volume for the mean sample magnetization, defined here as the radius r of a hemisphere above the sensor such that spins within the hemisphere contribute exactly half of $\overline{B}$, is given by $$V = \frac{2\pi}{3}(\kappa d_{NV})^3,$$

for $\kappa \approx 2.4$ a geometric constant estimated by numerical integration (FIG. 5A inset). The present design in accordance with this aspect, with mean NV depth d=6.5 μm, thus represents a tradeoff between (i) suppression of magnetic noise due to near-surface spin fluctuations, and (ii) minimization of the effective sensing volume for the thermal sample magnetization.

Figure 5B:
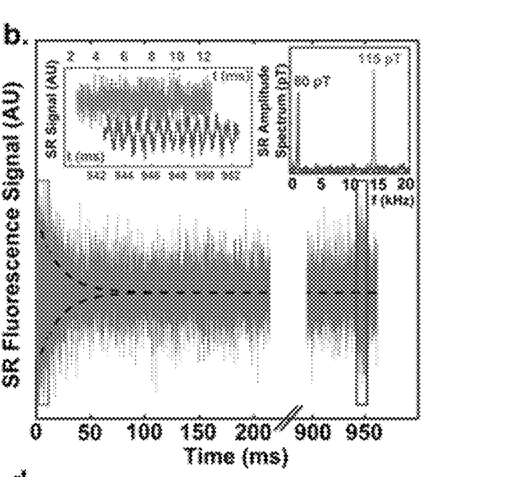
FIG. 5B depicts the detection of NMR from protons in glycerol.
Figure 5C:
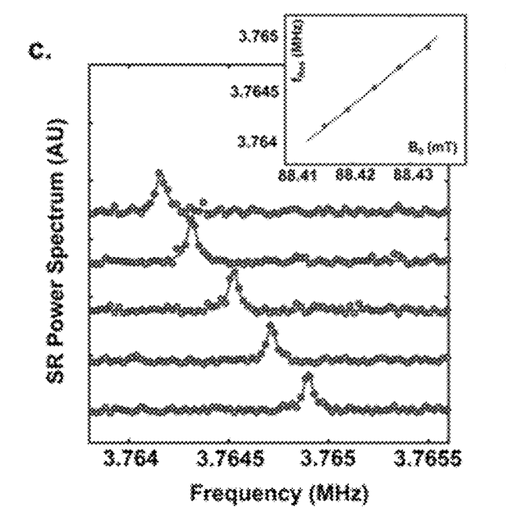
FIG. 5C is a power spectra of proton resonance frequencies obtained from glycerol FID data for various values of $B_0$.

Using the NV ensemble sensor, SR spectroscopy was applied to detect NMR from glycerol (C$_3$H$_8$O$_3$) molecules. The diamond was placed in a cuvette filled with glycerol (volume 0.64 mL) and aligned in the bias field of an electromagnet ($B_0=88$ millitesla). At the start of the experiment, a π/2 pulse was applied to tip the sample protons into the transverse plane of the Bloch sphere; their precession frequency was then measured by probing the NV centers with an SR sequence (parameters $\tau_{SR}=24.06$ μs and $n=4\times10^4$). The SR sequence duration was chosen to allow full population relaxation of the sample spins ($T_1\approx3\times10^{-2}$ s). After $7\times10^4$ averages, the nuclear FID was readily observable (FIG. 5B). Near the end of the SR sequence, after the sample spins were fully dephased, a coil antenna was used to drive a calibrated oscillating magnetic field pulse (zero-to-peak amplitude 90 pT, offset frequency δf=1.4 kHz from $f_0$, duration 12 ms). Comparison of integrated peak intensities in the SR power spectrum (FIG. 5B, inset) yielded a signal amplitude of 105 pT (zero-to-peak) for the glycerol FID, approximately consistent with the calculated value of 79 pT for a glycerol proton spin density of $\rho_p=6.7\times10^{28}$/m$^3$. To exclude the possibility of spurious detection associated with room noise or sensor imperfections, $B_0$ was swept over 0.02 millitesla and the SR protocol was repeated at each value. A linear fit to the measured FID line centers gave the correct value for the proton gyromagnetic ratio, $\gamma_p=(42.574\pm0.002)$ MHz/T (FIG. 5C).

Figure 5D:
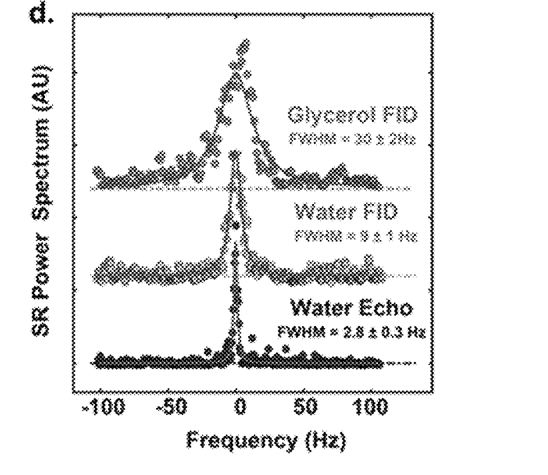
FIG. 5D is a plot of resolved FID signals obtained from protons in glycerol (upper plot) and pure water (lower plot)

To assess the spectral resolution limits of NMR detection using this technique, SR spectroscopy was carried out on a sample of pure water. The experimental conditions were identical those of the glycerol measurements, except the full SR sequence duration was extended (T=2 s) to account for water's longer decoherence and population decay lifetimes ($T_2$, $T_1$>2 s). The water FID linewidth in the SR power spectrum was 9±1 Hz FWHM (FIG. 5D), approximately a factor of ~25 narrower than the best spectral resolution obtained using NV correlation spectroscopy. Nevertheless, the observed lineshape was notably broader than the limiting value ($\Gamma_{FWHM}$≈0.2 Hz) associated with the intrinsic bulk decoherence lifetime of the sample.

A number of effects that could contribute to sample dephasing in the SR spectroscopy of water were investigated. Temporal inhomogeneity of the bias field $B_0$ was excluded by active stabilization using the electromagnet current supply, with residual fluctuations <0.05 µT RMS (equivalent to a proton linewidth $\Gamma$<2.5 Hz FWHM) over the course of the experiment. Gross spatial gradients in $B_0$ were ruled out by continuous wave electron spin resonance (cw-ESR) measurements at defined positions across the diamond surface, which showed $B_0$ variability <0.3 µT over an area of ~1 mm$^2$. To check for broadening due to far-detuned proton driving by the NV magnetometry sequence (which should scale approximately as $\Gamma \sim (\Omega_R \gamma_p/\gamma_{NV})^2/\Delta \sim 1$ Hz, for $\Omega_R$≈15 MHz the NV Rabi frequency, $\Delta$≈400 MHz the detuning, and $\gamma_p$=42.58 MHz/T and $\gamma_{NV}$=28.02 GHz/T the proton and NV gyromagnetic ratios, respectively), the NV Rabi frequency was reduced by up to a factor of three, but no narrowing of the proton resonance was observed. Finally, to test whether the proton line was broadened by magnetic field gradients associated with repolarization of the NV electronic spins at each SR readout iteration, (an effect estimated to contribute to broadening at the $\Gamma$~1 Hz level, the duty cycle of the magnetometry sub-sequence was varied (relative to the SR cycle period $\tau_{SR}$) from 0.18 (using XY8-2) to 0.53 (using XY8-6). This produced no significant increase in the proton linewidth, indicating that NV backaction was not the dominant dephasing mechanism.

Having thereby ruled out both $B_0$ inhomogeneity and interactions with the NV spins as primary determinants of the observed water FID signal width, the limited spectral resolution of the measurements was attributed to a combination of (i) micron-scale magnetic gradients due to susceptibility differences between sensor components, and (ii) dephasing due to diffusion of sample molecules close to magnetic defects at the diamond surface. This hypothesis was tested by applying π-pulses to the protons at times t=40 ms and t=120 ms after the start of the SR protocol, to refocus proton spin dephasing due to local gradients. This resulted in a proton linewidth of 2.8 Hz FWHM (FIG. 5D), approximately consistent with the measured distribution of Gaussian temporal fluctuations in $B_0$ (~2.5 Hz FWHM) recorded by the electromagnet feedback controller over the full duration of the experiment. Gradient-induced broadening is commonly observed in sub-µL volume NMR spectroscopy with microcoils, and can be mitigated by improved susceptibility matching in the sensor design. Dephasing due to shallow paramagnetic impurities may be reduced by careful diamond surface preparation using a combination of wet-etching and annealing in oxygen.

To illustrate the applicability of SR to molecular NMR, liquid-state FID spectra of trimethyl phosphate [PO(OCH$_3$)$_3$] and xylene [(CH$_3$)$_2$C$_6$H$_4$] were acquired. Trimethyl phosphate (TMP) is a standard reagent known to have large scalar coupling (J[P,H]≈11 Hz) between the methyl protons and the central $^{31}$P nuclear spin. Xylene is an aromatic solvent with substantial chemical shifts (~5 ppm of the proton Larmor frequency) due to different electron densities associated with the carbon ring structure and satellite methyl groups. Data were acquired using the same procedure as for glycerol and water FID spectra; the SR protocol parameters were $\tau_{SR}$=24 µs and n=4×10$^4$. The SR NMR spectrum for TMP (FIG. 6A) shows two clearly resolved peaks due to the J-coupled nuclei, with splitting $\Delta f_J$≈13±1 Hz. The SR NMR spectrum for xylene (FIG. 6B) also shows two peaks, split by $\Delta f_{CS}$≈20±2 Hz, consistent with the previously reported value for the chemical shift. The observed peak intensity ratio of ~2.2:1 in the xylene SR NMR power spectrum is as expected for the relative nuclear abundance of 6:4, with the protons in high electron-density methyl groups shifted to lower frequency. These measurements constitute the first demonstration of NV-detected NMR with spectral resolution sufficient to resolve frequency shifts due to molecular structure.

Those skilled in the art would readily appreciate that all parameters and configurations described herein are meant to be exemplary and that actual parameters and configurations will depend upon the specific application for which the systems and methods of the present invention are used. Those skilled in the art will recognize, or be able to ascertain using no more than routine experimentation, many equivalents to the specific embodiments of the invention described herein. It is, therefore, to be understood that the foregoing embodiments are presented by way of example only and that the invention may be practiced otherwise than as specifically described. The present invention is directed to each individual feature, system, or method described herein. In addition, any combination of two or more such features, systems or methods, if such features, systems or methods are not mutually inconsistent, is included within the scope of the present invention.

What is claimed is:

1. A system comprising:
   a solid state electronic spin system, wherein the solid state electronic spin system has a spin-state dependent fluorescence;
   a source of light;
   a source of first external perturbation, wherein the source of first external perturbation generates a magnetic field;
   a source of second external perturbation, wherein, the source of light and the first and second external perturbations are configured to coherently and independently manipulate the spin states of at least one solid state electronic spin system;
   a digital timing generator configured to synchronize the light and the first and second perturbations; and
   a detector to optically measure the solid-state electronic spins spin-state dependent fluorescence.

2. The system of claim 1, wherein, the solid state electronic spin system-is a nitrogen-vacancy (NV) spin in the high purity diamond lattice.

3. The system of claim 1, further comprising a source of third external perturbation comprising a radio frequency (RF) electromagnetic field source or an electronic spin resonance (ESR) field source.

4. The system of claim 1, wherein, the source of second external perturbation is a microwave field source.

5. The system of claim 1, wherein the detector is a CCD camera, or a photomultiplier, or a photodiode.

6. The system of claim 1, wherein the solid state electronic spin system comprises a defect in a crystal, and wherein a sample to be measured is placed at least one of on a surface of the crystal or in proximity of the solid state electronic spin system.

7. The system of claim 1, wherein the digital timing generator is configured to provide a sub-sequence of pulses of the light and the second perturbation designed to be selective for detecting oscillating magnetic signals near a central frequency, f.

8. The system of claim 1, wherein the solid state spin systems spin-dependent fluorescence is changed due to the interaction with the sample.

9. The system of claim 1, wherein the solid state spin systems spin-dependent fluorescence is changed due to the interaction with a sample.

10. The system of claim 1, wherein the source of light radiation is an optically pumped laser.

11. The system of claim 10, wherein the optically pumped laser has a wavelength of 532 nm (nanometer).

12. A method of measuring an oscillating magnetic field, comprising:
applying a first external perturbation field to a solid state electronic spin system having a spin-state dependent fluorescence, wherein the applying the first external perturbation field to the solid state electronic spin system comprises aligning the solid state electronic spin system with the first external perturbation field;
positioning a sample in proximity to the solid state electronic spin system, the comprising a source of oscillating magnetic fields;
obtaining a sequence of fluorescence intensity measurements by:
  i) pulsing a light source to generate light to align spins of the solid state electronic spin system;
  ii) pulsing a source of second external perturbation; and
  iii) detecting fluorescence of the solid state electronic spin system; wherein steps i) and ii) in each iteration are synchronized using a digital timing generator; and
repeating steps i), ii) and iii) for a predetermined number of iterations.

13. The method of claim 12, obtaining a sequence of fluorescent intensity measurements further comprises iv) pulsing a source of third external perturbation.

14. The method of claim 12, further comprising applying a Fourier transform to the sequence of fluorescent intensity measurements that were recorded at equal time intervals during each iteration.

15. The method of claim 13, wherein the solid state electronic spin system comprises a nitrogen-vacancy (NV) spin in a high purity diamond lattice.

16. The method of claim 13, wherein the third external perturbation comprises a radio frequency (RF) electromagnetic field source or an electronic spin resonance (ESR) field source.

17. The method of claim 12, wherein the source of second external perturbation is a microwave field source.

18. The method of claim 12, wherein the digital timing generator is configured to provide a sub-sequence of pulses of the light and the second perturbation designed to be selective for detecting oscillating magnetic signals near a central frequency, f.

19. The method of claim 18, wherein the sub-sequence of pulses has a duration that is an integer multiple of 1/f.

20. The method of claim 12, wherein the sample comprises a liquid sample having a volume between 10 to 100 pL (picoliter).

* * * * *